(12) United States Patent
Franey et al.

(10) Patent No.: US 6,245,993 B1
(45) Date of Patent: Jun. 12, 2001

(54) ELECTRONIC ASSEMBLY HAVING SHIELDING AND STRAIN-RELIEF MEMBER

(75) Inventors: John Philip Franey, Bridgewater; Boris Roman Wirstiuk, Clifton; Robert D. Yadvish, Bayonne, all of NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/416,069

(22) Filed: Oct. 12, 1999

(51) Int. Cl.$^7$ ..................................................... H01J 5/00
(52) U.S. Cl. ..................................... 174/50.56; 174/50.57
(58) Field of Search .............................. 174/50.56, 50.57

(56) References Cited

U.S. PATENT DOCUMENTS

| | | | |
|---|---|---|---|
| 252,392 | * | 1/1882 | Maxim ........................... 174/50.57 X |
| 2,513,870 | * | 7/1950 | Hoffman ........................ 174/50.57 X |
| 2,688,737 | * | 9/1954 | Oskerka, Jr. et al. ......... 174/50.57 X |
| 3,302,072 | * | 1/1967 | O'Neil .................................. 317/230 |
| 3,684,927 | * | 8/1972 | Correll ................................. 317/230 |
| 4,278,912 | * | 7/1981 | Vrijssen et al. ............... 174/50.57 X |
| 4,296,458 | * | 10/1981 | Smith et al. .................. 174/50.57 X |

* cited by examiner

Primary Examiner—Dean A. Reichard
Assistant Examiner—Charlie Nguyen

(57) ABSTRACT

Hermetically sealed electrical leads emanating from the neck portion of a conductive housing extend through a sleeve member that includes conductive and non-conductive parts. The sleeve member is dimensioned to firmly engage the neck portion of the housing. When so engaged, the electrical leads extend through longitudinal openings in the non-conductive part. In that way, a substantial extent of the leads is shielded. Moreover, the extent to which the leads can be laterally moved with respect to their hermetic seals is thereby significantly restricted.

12 Claims, 4 Drawing Sheets

ELECTRONIC ASSEMBLY HAVING SHIELDING AND STRAIN-RELIEF MEMBER

TECHNICAL FIELD

This invention relates to electronic component assemblies and, more particularly, to a member for providing shielding and strain-relief for electrical leads included in such an assembly.

BACKGROUND OF THE INVENTION

In a variety of applications of practical importance, environmentally sensitive circuitry included in a housing is designed to be interconnected via electrical leads to associated elements mounted on, say, a printed-circuit board. To protect the circuitry against potentially harmful factors such as moisture and dust, it is advantageous to hermetically seal the leads where they extend through openings in the housing.

Additionally, it is often important to shield the circuitry included in the housing from extraneous electromagnetic radiation in the surrounding environment, as well as to shield the environment from radiation generated by circuitry in the housing. This can be done, for example, by making the housing out of an electrically conductive material and connecting the housing to a point of reference potential.

Illustratively, an insulating material such as glass is formed around each of the electrical leads in the openings through the housing. In that way, the leads are both electrically insulated from the conductive housing and hermetically sealed with respect to the housing.

In practice, the leads that extend between the housing and the associated printed-circuit board serve in effect as antennas that pick up extraneous radiation present in the environment and/or transmit extraneous signals into the surrounding space. Signals picked up by or emanating from the leads constitute undesireable noise signals in the assembly.

Moreover, movement of the noted leads during or subsequent to manufacture of the assembly may stress and crack the aforementioned hermetic seals. In some cases, such movement of the leads may not only destroy the seals but also damage connections within the housing to which the leads extend.

Accordingly, efforts have continued by workers skilled in the art directed at trying to devise improved electronic assemblies. In particular, these efforts have been focused on attempting to provide better shielding of interconnecting leads and to minimize damage caused by movement of the leads. It was recognized that such efforts, if successful, would improve the manufacturability, reliability and operation of such assemblies.

SUMMARY OF THE INVENTION

In accordance with the principles of the present invention, hermetically sealed electrical leads extend through respective openings formed in a neck portion of a conductive housing of an electronic assembly. A mating sleeve member including a conductive part and longitudinally extending channels is designed to be press-fitted onto the neck portion. When so fitted, the conductive part of the sleeve member is in electrical contact with the housing and the leads extend through the channels in the member. In that way, the lead portions within the sleeve member are electrically shielded from picking up and/or transmitting noise signals. Additionally, the sleeve member serves to limit lateral movement of the leads, thereby ensuring that the hermetic seals in the housing will remain substantially strain-free.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Figure 1:
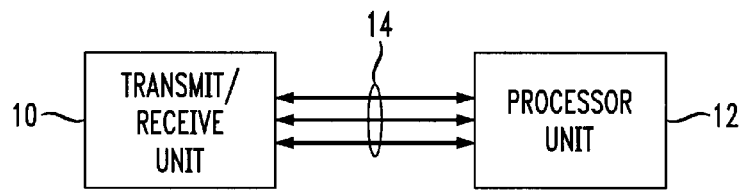
FIG. 1 is a simplified schematic representation of a conventional assembly.

Illustratively, FIG. 1 shows a typical electronic component assembly that includes a standard transmit/receive unit 10 interconnected with a conventional processor unit 12. Signals are sent back and forth between the units 10 and 12 via plural electrical leads 14. By way of a specific example, each of the leads 14 comprises a gold-plated copper wire.

Advantageously, the circuitry of the transmit/receive unit 10 (FIG. 1) is contained in a conductive housing that is connected to a point of reference potential such as ground. Illustratively, the housing is made of a conductive material such as stainless steel. In that way, the receiver portion in the unit 10 is electrically shielded from extraneous electromagnetic radiation that may be present in the environment surrounding the unit 10. In addition, the grounded housing provides protection against electrostatic discharge phenomena. Moreover, the grounded housing prevents radiation from the transmitter portion in the housing from being propagated into the space surrounding the unit 10.

Figure 2:
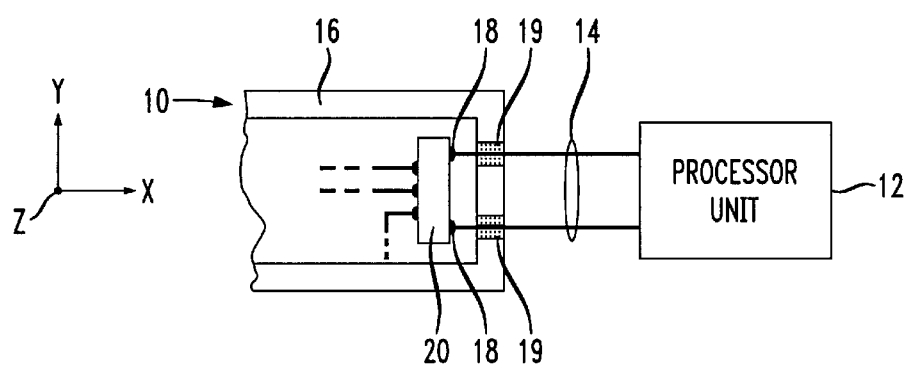
FIG. 2 is a cross-sectional side view of a portion of one of the components included in the FIG. 1 assembly.

FIG. 2 shows a portion of the right-hand section of the shielded transmit/receive unit 10 of FIG. 1. As indicated in FIG. 2, plural electrical leads 14 extend through respective channels formed in conductive housing 16. By way of example, the left-hand ends of the leads 14 are shown as being respectively connected to bonding pads 18 on a printed-circuit board 20 that constitutes part of the internal circuitry of the transmit/receive unit 10. Additionally, the right-hand ends of the leads 14 are, for example, connected to bonding pads on a standard printed-circuit board (not shown) in the processor unit 12.

Furthermore, it is advantageous to hermetically seal the leads 14 of FIG. 2 with respect to the housing 16. Conventionally, this is done, for example, by forming an insulating layer 19 around each of the leads 14 in the housing channels. Illustratively, molten glass is deposited in the channels around the individual leads 14 to provide the seals. This serves both to hermetically seal the leads with respect to the housing 16 and to electrically insulate the leads from the conductive walls of the channels in the housing.

During assembly, maintenance and operation of the assembly including the units 10 and 12, some lateral movement of the leads 14 (perpendicular to the indicated X direction) is inevitable. In some cases, such movement of the leads causes fracturing of the insulation 19 surrounding the leads in the housing channels. In turn, this can break one or more of the hermetic seals and thereby expose the circuitry in the unit 10 to harmful environmental factors.

Additionally, the leads 14 that extend between the units 10 and 12 of FIG. 2 constitute in effect antennas that pick up radiation that may exist in the space surrounding the units and/or that transmit extraneous signals into the surrounding space. Signals picked up by or emanating from the leads 14 are of course undesireable because they constitute noise in the depicted assembly.

Figure 3:
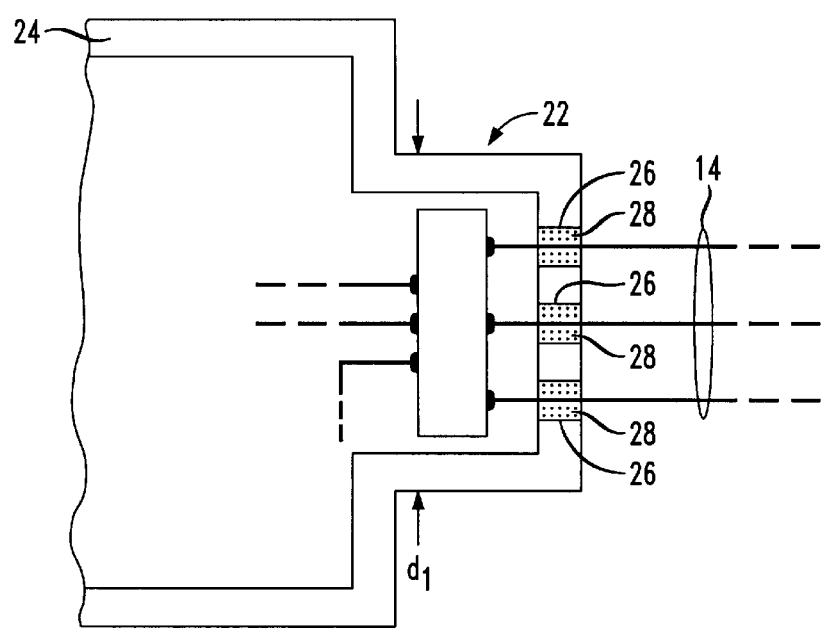
FIG. 3 shows the FIG. 2 portion modified in accordance with the principles of the present invention.

Illustratively, in accordance with the principles of the present invention, a part of the conductive housing 16 shown in FIG. 2 is machined or otherwise formed to have a protruding neck portion. An illustrative such neck portion 22 extending from the right-hand side of a conductive housing 24 is represented in FIG. 3. By way of a particular example, the portion 22 comprises a cylindrically shaped member having a diameter d1.

As in FIG. 2, hermetically sealed electrical leads 14 extend through channels in the conductive housing 24 of FIG. 3. These channels 26 extend through the right-hand wall of the housing in the neck portion 22 of FIG. 3.

In FIG. 3, the leads 14 are electrically insulated from and hermetically sealed with respect to the housing 24. This is done by forming an electrically insulating sleeve 28 around each of the leads 14 in the channel regions. Illustratively, molten glass is poured into each channel around its respective centrally positioned wire to form the. insulating sleeve, which hermetically seals and insulates each wire that extends from the housing 24.

Figure 4:
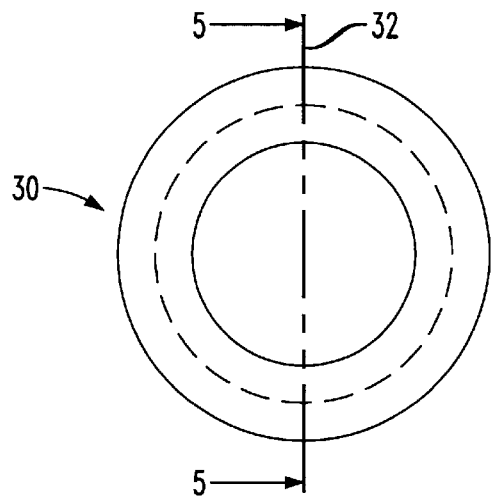
FIG. 4 is an end view of one element of a member made in accordance with the invention and designed to mate with the FIG. 3 structure.

In further accordance with the invention, a unique sleeve member is designed to be press-fitted onto the neck portion 22 of the structure shown in FIG. 3. An end view of one part 30 of a specific illustrative such member, for the exemplary case in which the neck portion 22 of FIG. 3 is cylindrically shaped, is depicted in FIG. 4. The part 30 is made of a conductive material. Advantageously, in the case in which the housing 24 (FIG. 3) is made of stainless steel, the part 30 is also made of stainless steel.

Figure 5:
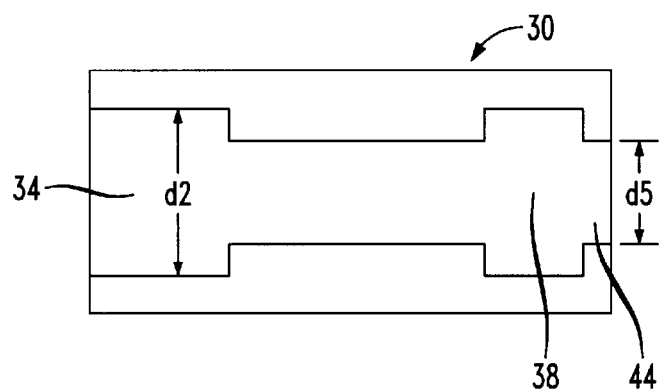
FIG. 5 is a cross-sectional side view of the FIG. 4 element as viewed in the direction of arrows 5.

A side view of the part 30 shown in FIG. 4 is represented in FIG. 5. In particular, FIG. 5 is a cross-sectional side view of the part 30 as viewed in the direction of arrows 5 of FIG. 4 at the reference line 32.

The specific illustrative part 30 shown in FIG. 5 includes a cylindrically shaped left-hand portion that comprises a chamber 34 having a diameter d2. The diameter d2 is selected with respect to d1 (FIG. 3) such that the left-hand end of the part 30 of FIG. 5 can be press-fitted onto the neck portion 22 of FIG. 3. More specifically, the design of the two mating structures is such that, when the part 30 is press-fitted onto the neck portion 22, an intimate and robust mechanical connection therebetween is established. Moreover, a good electrical connection between the mating press-fitted conductive structures is also thereby established (for example, less than about one ohm). In one particular illustrative case, d1 and d2 shown in FIGS. 3 and 5 have the values 8.68 millimeters (mm) and 8.74 mm, respectively.

Figure 6:
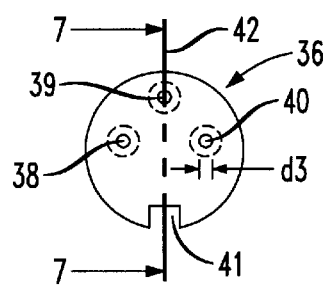
FIG. 6 is an end view of another element made in accordance with the invention and designed to be combined with the element shown in FIGS. 4 and 5.

In one embodiment of the invention, the herein-described sleeve member includes a second part 36, an end view of which is shown in FIG. 6. The part 36 is designed to fit in a right-hand portion of the part 30 (FIG. 5). Specifically, the part 36 is dimensioned to be pressed into a chamber 38 of the part 30. For this purpose, the part 36 is advantageously made of a resilient material comprising, for example, a polymer such as nylon, polyethylene or styrene.

For illustrative purposes, and so as to not unduly clutter the drawing, the specific sleeve member described herein is adapted to accommodate only four leads extending between the aforenoted units 10 and 12. In that particular case, the part 36 of FIG. 6 includes four through-openings 38 through 41. All four of these openings may, for example, have the shapes of truncated cones. Such shapes are designed to facilitate entry of leads into the back side of the part 36 (FIG. 6). Leads inserted into the back side extend out from the front of the part 36 shown in FIG. 6. Illustratively, the diameter d3 of each circular opening on the front surface of the part 36 of FIG. 6 is only slightly greater than the diameter of the wire intended to extend therethrough. In that way, lateral movement of the leads with respect to their respective front-surface openings is significantly restricted.

Rather than making all the openings through the part 36 of FIG. 6 the same, it is sometimes advantageous to form one or more of the openings in the shape of a keyway. Thus, for example, in FIG. 6, the through-opening 41 is illustratively shown as a keyway in the part 36. In cases where leads coming out of the openings 38 through 40 extend to bonding pads on the top of a printed-circuit board in the unit 12 (FIGS. 1 and 2) and a ground lead coming out of the opening 41 is designed to extend to a bonding pad on the bottom of the board, the keyway 41 allows a greater degree of movement in routing such a ground lead to the bottom of the printed-circuit board. And, since the ground lead is typically simply connected to the exterior of the conductive housing, and not hermetically sealed, such greater freedom of movement stands no chance of breaking any of the aforedescribed hermetic seals.

Additionally, the keyway 41 illustrated in FIG. 6 serves to facilitate alignment. Thus, for example, during manufacture an operator can use the keyway to align the part 36 with respect to the ground wire of the assembly.

Figure 7:
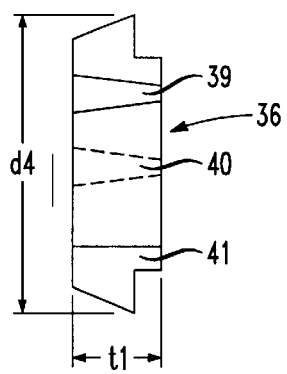
FIG. 7 is a cross-sectional side view of the FIG. 6 element as viewed in the direction of arrows 7.

FIG. 7 is a cross-sectional side view of the part 36 shown in FIG. 6 as viewed in the direction of arrows 7 at the reference line 42. The funnel-shaped contour of the through-openings 39 and 40 is evident in FIG. 7. (If desired, the keyway 41 may also be funnel-shaped.)

Figure 8:
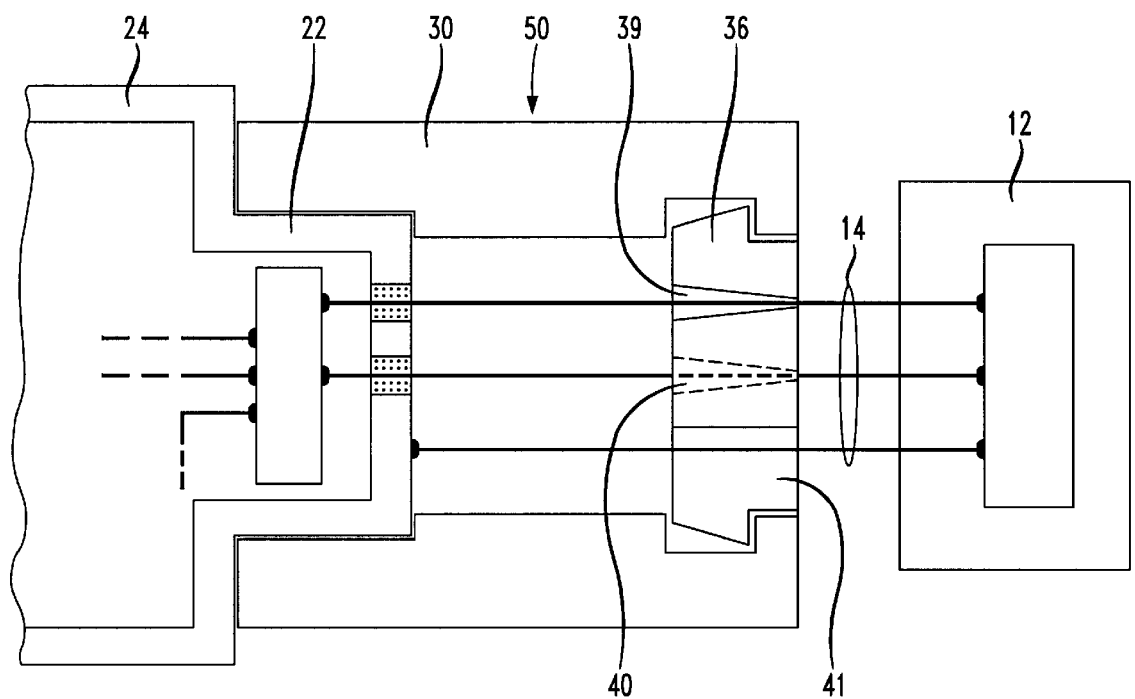
FIG. 8 is a cross-sectional side view that shows the element depicted in FIGS. 4 and 5 combined with the element represented in FIGS. 6 and 7 and, further, shows the combined elements mated with the FIG. 3 housing in accordance with the invention; and and FIG. 9 is a cross-sectional side view of another specific illustrative embodiment of the principles of the present invention.

The diameter d4 of the part 36 of FIG. 7 is slightly greater than the diameter d5 of the entrance 44 to the right-hand chamber 38 shown in FIG. 5. When the left-hand side of the FIG. 7 part is pressed into the chamber entrance 44 (FIG. 5), the part 36 temporarily deforms sufficiently to snap into the chamber 38, where it is securely maintained, as indicated in FIG. 8. In one particular illustrative case in which the part 36 was injection-molded out of nylon, the thickness t1 (FIG. 7) of the part 36 was 4.52 mm and the aforenoted diameters d4 and d5 were approximately 8.2 mm and 7.88 mm, respectively.

FIG. 8 shows an assembled sleeve member 50 made in accordance with the principles of the present invention. The assembled member comprises the above-described parts 30 and 36. Further, FIG. 8 shows the sleeve member 50 press-fitted onto the neck portion 22 of the conductive housing 24. As before, leads 14 extend between the housing 24 and the associated processor unit 12. In the particular case represented in FIG. 8, a substantial portion of the longitudinal extent of the leads 14 is encompassed within and thereby shielded by the conductive part 30 of the sleeve member 50. Additionally, intimate electrical contact between the conductive member 50 and the conductive housing 24, when they are press-fitted together, ensures that the member 50 and the housing 24 are electrically connected to the same point of reference potential.

Initially, as the member 50 of FIG. 8 is moved toward the neck portion 22 to engage it, the funnel-shaped openings 39 and 40 facilitate entry of the right-hand lead ends into their respective openings. It is apparent that when the member 50 is in place, as indicated in FIG. 8, the longitudinally extending leads 14 are significantly limited in the extent to which they can be laterally moved. As a result, when the lead portions to the right of the right-hand end of the member 50 are moved in any direction during assembly or subsequent thereto, there is virtually no likelihood of thereby imposing lateral strain on the hermetic-seal material surrounding the leads in the neck portion 22. Accordingly, in practice the seals remain intact even as the leads 14 are laterally moved to extreme positions.

Figure 9:
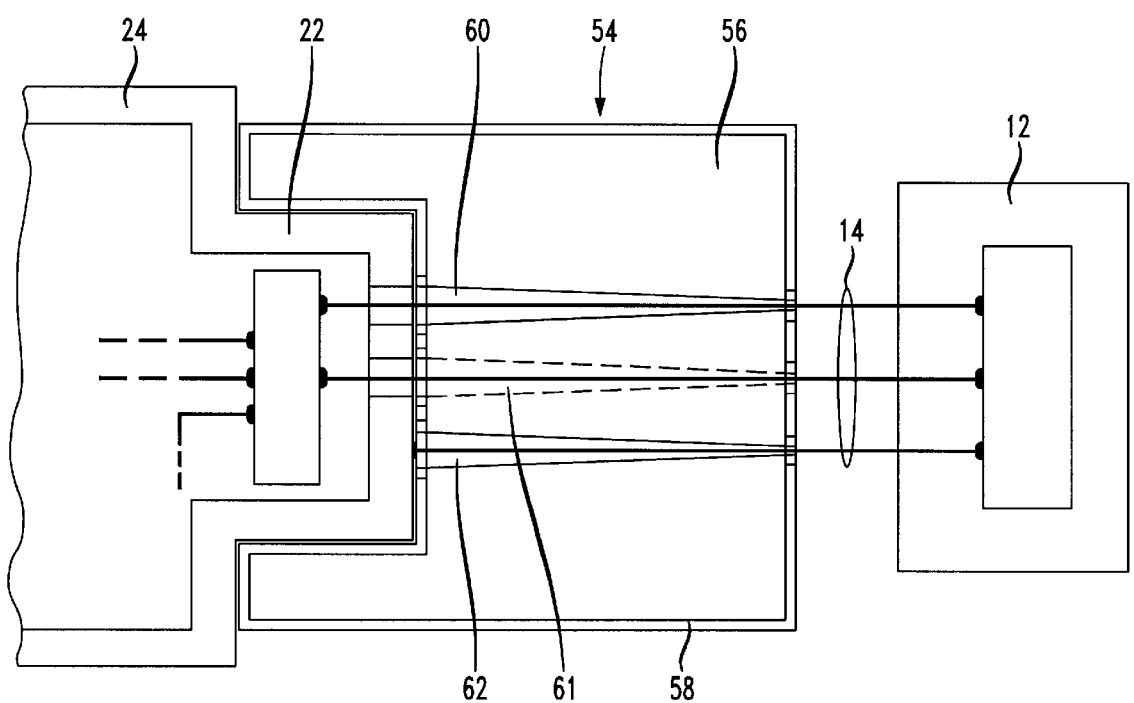

FIG. 9 shows another specific illustrative embodiment of the principles of the present invention. As before, a sleeve member is press-fitted onto the neck portion 22 of the conductive housing 24. But, in this case, as indicated in FIG. 9, the sleeve member 54 comprises, for example, a cylindrical non-conductive piece 56 (made, for instance, of a plastic material such as nylon) having a conductive layer 58 (made, for example, of conductive epoxy paint or any other standard conductive coating/layer) on surfaces thereof. The left-hand end of the member 54 contains an indented portion designed to snugly engage the neck portion 22 when the member 54 is press-fitted thereon. When so fitted, the conductive layer 58 and the conductive housing 24 are established and maintained in good electrical contact with each other.

Additionally, the non-conductive piece 56 of FIG. 9 advantageously contains funnel-shaped longitudinally extending through-openings 60 through 62 through which respective ones of the wires 14 extend. (In the particular illustrative FIG. 9 embodiment, no keyway is included. But, to facilitate wiring of the assembly and alignment of the leads 14 with respect to the piece 56, a keyway may be included if desired.) The diameters of the openings 60 through 62 on the right-hand face of the piece 56 are dimensioned to be only slightly greater than the diameters of the wires extending therethrough. In that way, during flexing of the right-hand or free ends of the leads 14, lateral movement of the leads within the neck portion 22 is made virtually impossible. Accordingly, in practice the hermetic seals in the portion 22 remain intact with a high degree of certainty over a wide variety of assembly, maintenance and operating conditions. And, of course, as before, the sleeve member 54 including the conductive layer 58 is also effective to shield the portions of the leads 14 that are contained within the indicated channels in the member 54.

Finally, it is to be understood that the various above-described arrangements are only illustrative of the application of the principles of the present invention. In accordance with these principles, numerous other arrangements may be devised by those skilled in the art without departing from the spirit and scope of the present invention. Thus, for example, the cylindrically shaped sleeve members specified above are illustrative only. Other shapes, for example square or rectangular, are feasible for the sleeve members. Moreover, the part 30 of FIG. 8 may, if desired, be made to have a keyway aligned with the keyway in the part 36.

What is claimed is:

1. An electronic component assembly comprising
   a conductive housing having hermetically sealed electrical leads extending from a specified portion thereof,
   and a sleeve member having a first end portion designed to be mounted on the specified portion of said conductive housing and having a second opposite-end portion, said sleeve member also having a conductive surface portion and an interior non-conductive portion having longitudinally extending through-openings that extend through said non-conductive portion and extend to said second end portion where each such through-opening has a dimension that allows substantially no lateral movement at said second end portion of the leads extending through said second end portion, said sleeve member being mounted on the specified portion of said housing with said leads extending through said openings and said conductive surface portion in electrical contact with said conductive housing, whereby the longitudinal extent of the leads within said sleeve member is thereby shielded and lateral movement of the leads where they extend through the housing is significantly limited.

2. An electronic component assembly comprising
   a conductive housing having a neck portion, said housing including circuitry therein,
   plural through-openings formed in the neck portion of said housing,
   plural longitudinally extending electrical leads respectively extending through said openings, each of said leads having one end thereof connected to said circuitry,
   material surrounding each of said leads in said openings to insulate the leads and hermetically seal them with respect to said housing,
   and a sleeve member fitted to engage said neck portion, said sleeve member including
      a first end portion designed to be engaged with the neck portion of said housing,
      a second opposite-end portion,
      longitudinally extending through-openings aligned with the leads extending through the openings in said housing, the diameters of the openings where the free ends of the leads extend from said sleeve member at said opposite-end portion being dimensioned to allow substantially no lateral movement of the leads within the sleeve member when said sleeve member is engaged with said neck portion,
      and outer surface portions comprising conductive material,
   whereby, when said sleeve member is engaged with said neck portion, the longitudinal extents of said leads within said sleeve member are electrically shielded and lateral movement of the leads in the material in the openings in said housing is substantially restricted.

3. An assembly as in claim 2 wherein at least some of the through-openings in said sleeve member are funnel-shaped to facilitate entry of the free ends of said leads into the openings in said sleeve member when the sleeve member is moved into engagement with said neck portion.

4. An assembly as in claim 3 wherein said neck portion and said sleeve member are each cylindrically shaped.

5. An assembly as in claim 4 wherein the material surrounding the leads in the openings in said housing comprises glass.

6. An electronic component assembly comprising a conductive housing having a neck portion, said housing including circuitry therein, plural through-openings formed in the neck portion of said housing, plural longitudinally extending electrical leads respectively extending through said openings, each of said leads having one end thereof connected to said circuitry, material surrounding each of said leads in said openings to insulate the leads and hermetically seal them with respect to said housing, and a sleeve member fitted to engage said neck portion, said sleeve member including longitudinally extending through-openings aligned with the leads extending through the openings in said housing, the diameters of the openings where the free ends of the leads extend from said sleeve member being dimensioned to allow substantially no lateral movement of the leads within the sleeve member when said sleeve member is engaged with said neck portion, and outer surface portions comprising conductive material, whereby, when said sleeve member is engaged with said neck portion, the longitudinal extents of said leads within said sleeve member are electrically shielded and lateral movement of the leads in the material in the openings in said housing is substantially restricted, wherein at least some of the through-openings in said sleeve member are funnel-shaped to facilitate entry of the free ends of said leads into the openings in said sleeve member when the sleeve member is moved into engagement with said neck portion, wherein said neck portion and said sleeve member are cylindrically shaped, wherein the material surrounding the leads in the openings in said housing comprises glass, and wherein at least one of the through-openings in said sleeve member comprises a keyway, thereby to facilitate alignment of said sleeve member with respect to the leads extending from said housing.

7. An assembly as in claim 6 wherein said housing comprises stainless steel.

8. An assembly as in claim 7 wherein said sleeve member includes first and second parts, said first part comprising a conductive hollow cylinder having an enlarged chamber at each end thereof, one of said chambers being dimensioned to engage the neck portion of said housing, and the other chamber being dimensioned to retain said second part, and said second part comprising a non-conductive cylinder having longitudinally extending through-openings for said leads.

9. An assembly as in claim 8 wherein said first part comprises stainless steel.

10. An assembly as in claim 9 wherein said second part comprises a resilient material.

11. An assembly as in claim 7 wherein said sleeve member comprises a non-conductive cylinder having a conductive layer on outer surfaces thereof, said cylinder having a chamber at one end thereof dimensioned to engage the neck portion of said housing, said cylinder having longitudinally extending through openings for said leads.

12. An assembly as in claim 11 wherein said non-conductive cylinder comprises a plastic material.

* * * * *